United States Patent [19]
Haupt et al.

[11] Patent Number: 5,596,603
[45] Date of Patent: Jan. 21, 1997

[54] DEVICE FOR WIRELESS TRANSMISSION OF DIGITAL DATA, IN PARTICULAR OF AUDIO DATA, BY INFRARED LIGHT IN HEADPHONES

[75] Inventors: Axel Haupt, Langenhagen; Karl-Hermann Delibruegge, Hannover, both of Germany

[73] Assignee: Sennheiser electronic KG, Wedemark, Germany

[21] Appl. No.: 293,972

[22] Filed: Aug. 22, 1994

[30] Foreign Application Priority Data

Aug. 23, 1993 [DE] Germany .......................... 43 28 252.0

[51] Int. Cl.⁶ .................................................. H04B 14/04
[52] U.S. Cl. .......................... 375/242; 275/246; 275/253; 370/345; 370/470; 371/37.1
[58] Field of Search .................................. 375/242, 253, 375/246, 359; 341/55; 370/82, 83, 84, 53, 69.1, 77; 371/42, 37.1, 46, 8.2

[56] References Cited

U.S. PATENT DOCUMENTS

| | | | |
|---|---|---|---|
| 4,173,014 | 10/1979 | Leighou et al. | 340/146.3 H |
| 4,313,194 | 1/1982 | Maitre et al. | 370/69 |
| 4,821,260 | 4/1989 | Klank et al. | 370/77 |
| 5,323,396 | 6/1994 | Lokhoff | 370/83 |
| 5,327,520 | 7/1994 | Chen | 381/29 |

*Primary Examiner*—Stephen Chin
*Assistant Examiner*—Thuy L. Nguyen
*Attorney, Agent, or Firm*—McAulay Fisher Nissen Goldberg & Kiel, LLP

[57] ABSTRACT

Infrared light is used in a device for wireless transmission of digital data, e.g. in headphones. In order to satisfy the strict requirements regarding compactness and power consumption, it is proposed that three digital stereo sampling values are encoded in data frames of 128-bit length for channel coding. Control characteristics and synchronizing characteristics are added to these data frames. A special coding rule is used for the sampling value coding.

13 Claims, 5 Drawing Sheets

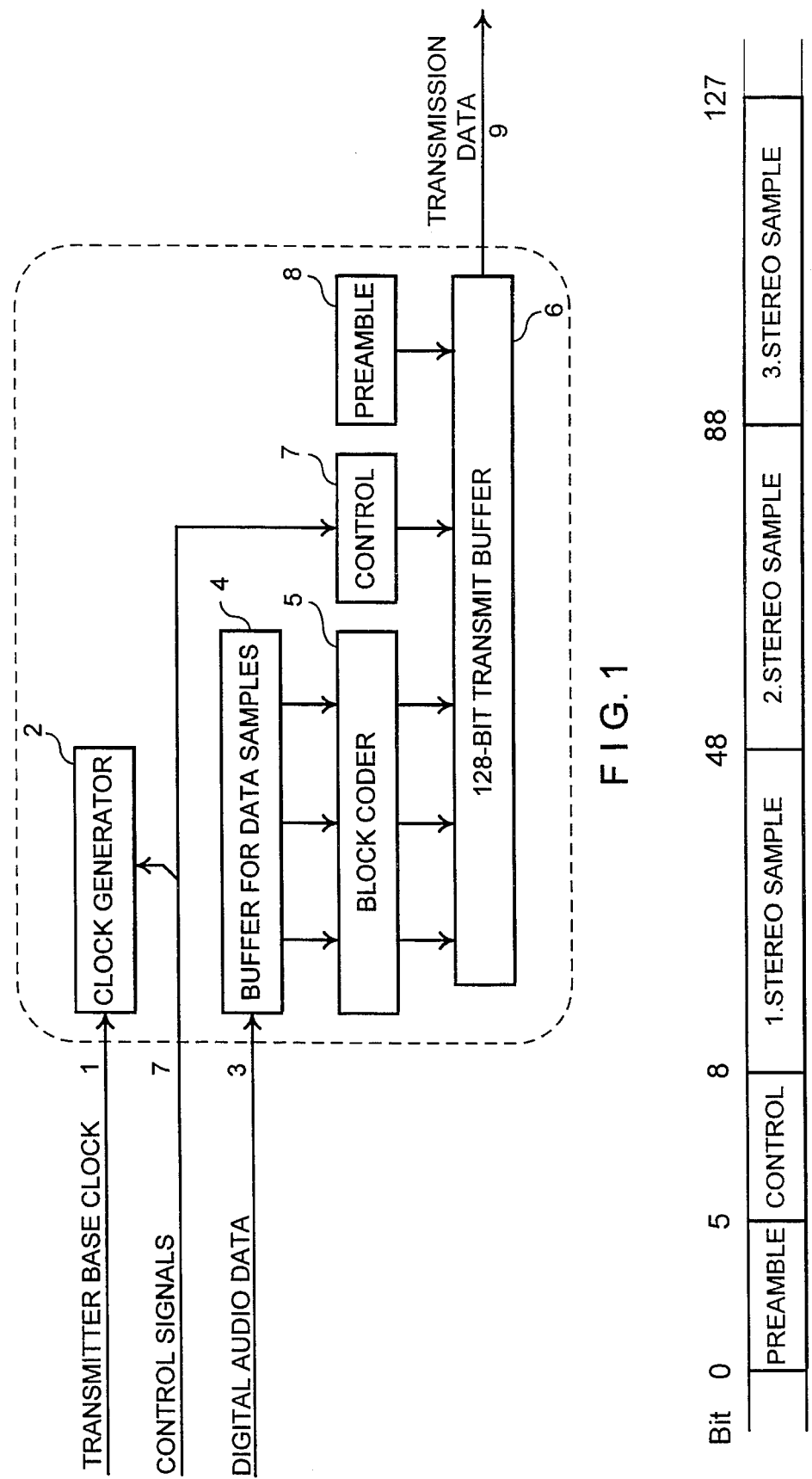

DEVICE FOR WIRELESS TRANSMISSION OF DIGITAL DATA, IN PARTICULAR OF AUDIO DATA, BY INFRARED LIGHT IN HEADPHONES

BACKGROUND AND OBJECT OF THE INVENTION

The primary object of the present invention is the transmission of digital audio data to wireless headphones using infrared light. This device is subject to exacting requirements with respect to required space and power consumption.

SUMMARY OF THE INVENTION

These requirements are satisfied according to the invention by a plan for a simple small-bandwidth channel coding which can be decoded in a simple manner and which enables clock pulse recovery. In principle, the object in devices of this type is to produce a synchronous total system. In other words, all clock pulses in the transmitter and receiver are derived directly or indirectly via integral divisors/multipliers from the sampling timing of the digital audio source. An asynchronous system would require components preventing disturbances in analog reproduction due to a large number or an insufficient number of available sampling values.

The transmission system proposed herein is a synchronous system. The data stream generated for wireless transmission contains little coding overhead and accordingly has a relatively small bandwidth. Nevertheless, it favorably supports clock pulse recovery and data recovery on the reception side. As a result of economical design on the reception side, this process is especially suitable for battery-operated receivers.

This system is particularly suitable for applications using digital audio interfaces corresponding to DIN EN 60958 (digital tone interfaces). The required clock pulses and control signals and the audio data for the transmission device described herein can be generated by commercially available modules (e.g., Yamaha YM 3436 C).

An embodiment example of the invention is shown in the drawings and in the following description.

BRIEF DESCRIPTION OF THE DRAWINGS

FIG. 1 shows a coding device;

FIG. 2 shows a data frame of the coding device of FIG. 1;

DESCRIPTION OF THE PREFERRED EMBODIMENTS

Figures 3, 4:
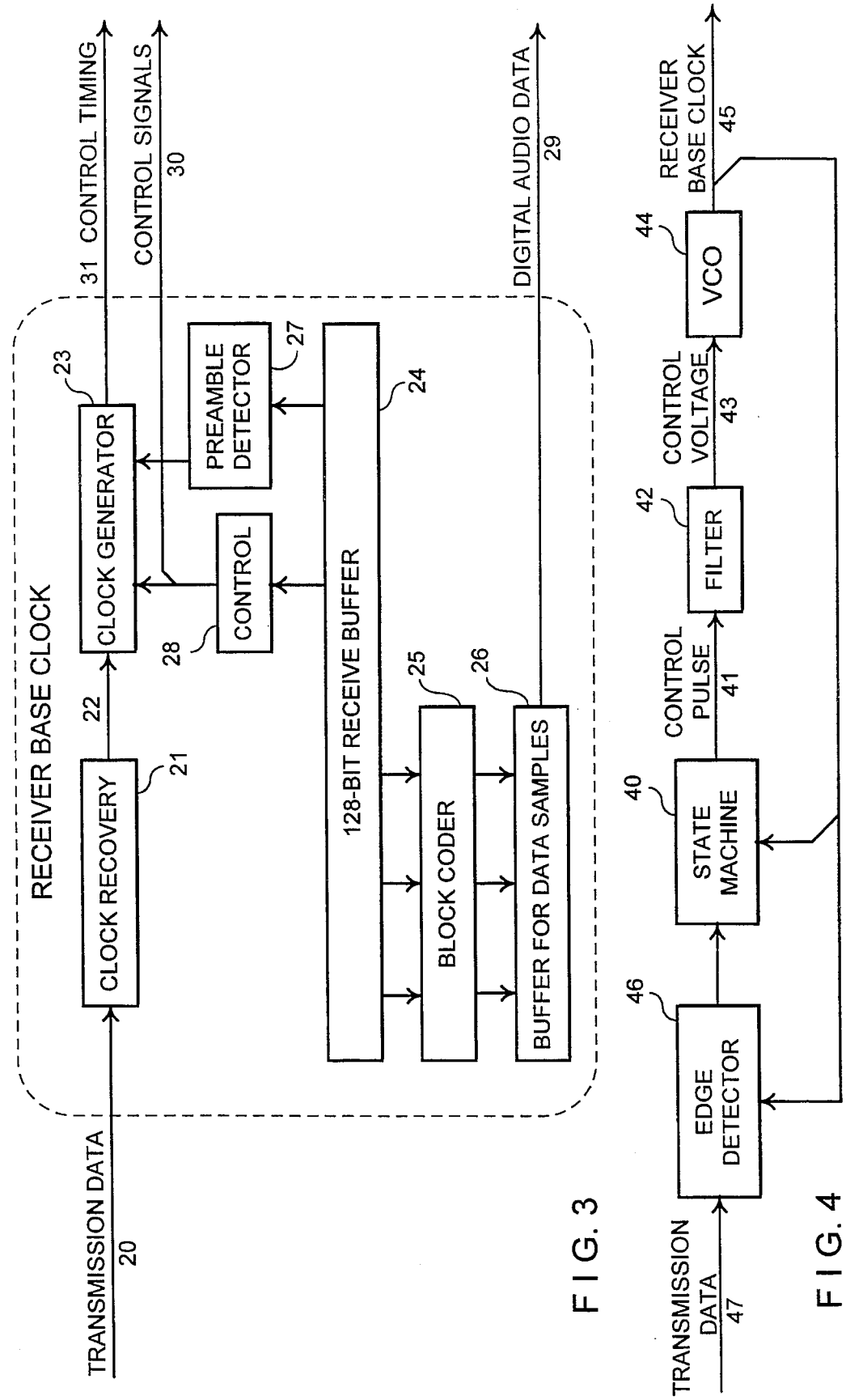
FIG. 3 shows a decoding device.
FIG. 4 shows a circuit structure.

The coding device described with reference to FIG. 1 and the decoding device shown in FIG. 3 are tuned to one another in the following manner.

The object of the coding device is to generate a stream of transmission data from the incoming digital audio data. According to the invention, a data frame with a 128-bit length which can accommodate three stereo sampling values, each having a word length of 2×16 bits, is constructed according to FIG. 2 for this purpose. These data frames are sent continuously.

The data samples are recoded prior to inclusion in the data frame. For this purpose, evenly 4 bits of the sampling value are replaced by 5 bits of the code. Accordingly, every stereo sampling value has a word length of 2×20 bits.

According to the invention, the purpose of this coding is to generate many level changes in the transmission data stream. This is important for clock recovery in the decoding device as will be discussed below. The coding is shown in Table 1. According to the invention, the allocation is selected in such a way that the 4-bit groups at the beginning and the end of Table 1 that frequently occur in digital audio data are assigned to 5-bit codes with several level changes, in particular also when a plurality of identical 4-bit groups occur consecutively in the data signal. Proceeding from the start or the end of the table, the prioritizing of the 4-bit groups, and so also the number of level changes in the coded signal, decreases toward the middle.

A 5-bit group which is never contained in the data stream in arbitrary sequences of 5-bit groups from Table 1 is placed at the beginning of the data frame as a preamble. The 5-bit group "00001" is used by way of example. It serves as a synchronizing characteristic in the decoding device for detecting the start of the frame.

As will be discussed in the following, only one of the control bits contained in the data frame is used; the other control bits remain available.

Sampling rates of 32 kHz, 44.1 kHz and 48 kHz with a 16-bit quantization width are conventional in audio technology. These sampling rates are also used in particular in DIN EN 60958 (digital tone interface). By selecting the data frame according to FIG. 2, it is possible to use the same transmission data rate for both sampling rates of 32 kHz and 48 kHz if only two of the three possible data sample positions are used in the case of 32 kHz. The third position is then advisably filled by a filler pattern. This strategy makes it easier for the decoding device to restore timing, since the frequency range to be detected need only be designed for 44.1 kHz and 48 kHz. In this way, phase-locked loops normally used to recover clock can have simpler dimensions and operate in a more reliable manner. A control bit is used to inform the decoding unit that not all of the sampling value periods in the data frame are occupied.

The data frames according to FIG. 2 are generated by a coding device corresponding to FIG. 1. Proceeding from a transmitter base clock rate 1 of 256× sampling rate, all necessary clock pulses within the coding device can be derived by integral divisors in the clock generator 2. The digital audio data 3 are sent serially to a buffer 4 for serial-parallel conversion. They are then sent to the transmission buffer 6 in parallel through the block coder 5 which carries out a recoding corresponding to Table 1. The control bit and other user control bits are set by the control coder 7 corresponding to the utilization of the sampling value positions indicated above. The preamble is added from a register 8.

According to the invention, the transmission buffer 6 which is filled in this way is set at continuous output at a continuous clock rate of 256× sampling rate/6 when three sampling value positions are used or at 256× sampling rate/4 when using two positions. This ensures that the amount of incoming data entering the coding device matches the outgoing data.

The control signals 7 applied to the input of the coding device contain the bit timing and word timing of the digital audio data and a coding of the applied sampling rate. When the coding device is used together with interface signals corresponding to DIN EN 60958, the digital audio data 3, control signals 7 and base clock rate 1 can be supplied directly by commercially available interface decoders (e.g., Yamaha YM 3436 C). The transmission data rates indicated in Table 2 apply in this case.

The object of the decoding device is to extract the digital audio data from the transmission data and send them to a signal processing device downstream. A suitable arrangement is shown in FIG. 3. The transmission data 20 are first fed to a clock pulse recovery 21 which derives the receiver base clock rate 22 from the transmission data 20. The clock rate 22 is set to an integral multiple of the transmission data rate 20. An appropriate arrangement for this purpose will be discussed more fully in the following. The clock generator 23 derives all of the control clock rates needed in the decoding device from the base clock rate 22 by means of integral divisors.

The incoming transmission data 20 are fed to a receive buffer 24. They are input in parallel for the purpose of decoding. The sampling values are reconstructed via a block decoder which cancels the coding specified in Table 1 and are made available in a buffer 26 for transmission. The frame-synchronous decoding is enabled by a preamble detector 27 which detects the aforementioned bit pattern in the data stream. Further, the control information is gathered from the data stream via the control decoder 28.

Since only 16 of the 32 possible code words are used in the coding of Table 1, the block coder can detect transmission errors simply by checking whether or not the incoming data are contained in the coding table. If they are not, a transmission error has definitely occurred.

Different interface formats can be implemented for the control timing 31, control signals 30 and digital audio data 29 depending on the construction of the decoding device. In a pattern shown here, the I²S bus format (Philips) is used. Accordingly, a wide assortment of commercially available signal processing modules such as digital-to-analog converters or signal processors can be directly connected. But other serial interface formats may also be realized in principle.

Special attention must be paid to the clock pulse recovery 21. It determines the quality of all clock rates supplied in and by the decoding unit. This is particularly important when digital-to-analog converters are connected downstream.

Phase-locked loops (PLL) in the form of integrated modules which are usually used for the purpose of clock pulse recovery may not be used in the present instance owing to the structure of the transmission data. Due to the fact that a plurality of identical bits can occur consecutively in the data stream, the known modules cannot be set to the transmission signal.

The circuit structure indicated in FIG. 4 is capable of achieving a faultless clock pulse recovery in the transmission data used in this case. This structure corresponds to known phase-locked loops, the phase comparator in this instance being replaced by a digital state machine 40 which operates in a special manner according to the invention. The control pulses 41 sent by the state machine 40 are integrated up to a control voltage 43 by a filter 42. The voltage-controlled oscillator (VCO) 44 supplies the receiver base clock rate which in turn clocks the state machine 40.

At each clock pulse, the state machine decides on the next state to be switched to. Aside from the current state, the output signal of the signal edge detector 46 is used as a criterion for this decision. This shows whether or not a change in level has occurred in the transmission data 47 since the last clock pulse.

By definition, the control loop is locked in when the receiver base clock rate 45 is an integral multiple of the transmission data rate 47 and the phase angle between the base clock rate 45 and the transmission data 47 is constant. The resolution and precision of control increase with the magnitude of the multiple. A factor of 12 is assumed for the purpose of further discussion. This factor results in a receiver base clock rate of 512× sampling rate. The factor 12 also means that the switching logic passes through 12 clocks and accordingly 12 sequential states for the duration of an individual bit cell of transmission data. In principle, it is also possible to use a higher or lower multiple, but this results either in very high base clock rates with an unnecessarily high hardware power consumption or in a poor control resolution with greater phase uncertainty. In addition, by using a base clock rate of 512× sampling rate, simple binary divisors can be used to derive all necessary clock rates of N× sampling rate for conventional output interfaces, where N is power of 2.

Figure 5:
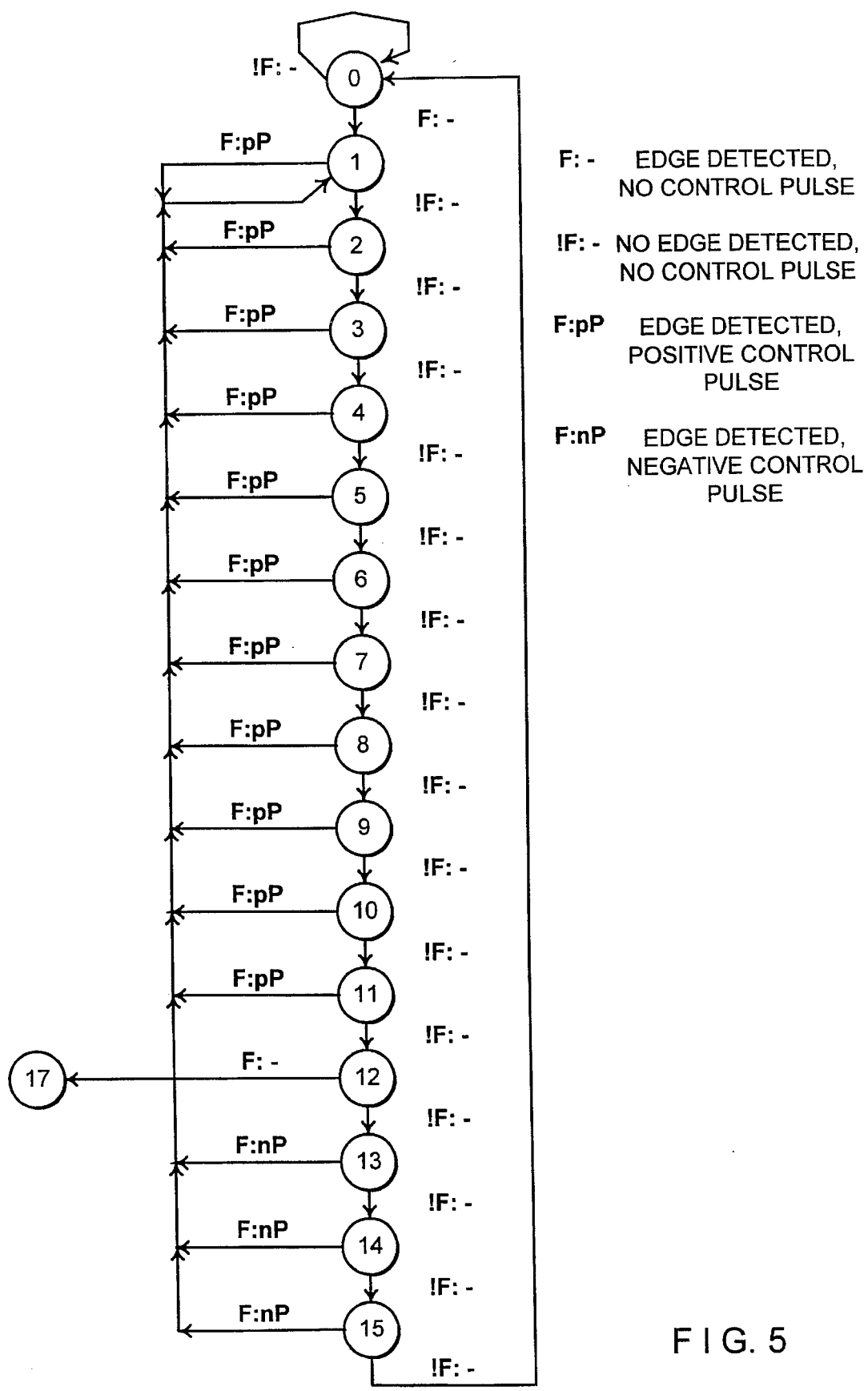
FIGS. 5 and 6 show a state machine.

The state machine according to the invention begins operation in the 0 state in the frequency-selective mode corresponding to FIG. 5. It remains in this mode until a signal edge is reported by the edge detector 46. It then progresses by one state for every clock pulse 45, performing a kind of clock pulse counting. If the edge detector 46 signals another edge already in states 1 to 11, the current frequency of the VCO 44 is too low. When jumping to the 1 state, a positive control pulse is sent. A clock pulse is already counted again at the same time. If another edge is signaled in states 13–15, the current frequency of the VCO 44 is too high. When jumping to the 1 state, a negative control pulse 41 is sent. If the state machine runs beyond state 15, it returns to the neutral state 0 without sending a control pulse. This occurs whenever the frequency of the VCO 44 is much too high or when at least two identical bit cells occur consecutively in the transmission data stream 47. When the VCO frequency is too high, the filter lowers its control voltage automatically due to physical leakage effects. The frequency accordingly returns automatically to the control range of the state machine.

The frequency is correct when another edge is reported to the state machine in state 12. In this case, it exits the frequency-selective mode and jumps to state 17 in the phase-selective mode corresponding to FIG. 6. Since the frequency is now correct, the state machine is now, after another 11 clock pulses, in state 16 where the next edge is expected. If the frequency is still somewhat high, the next edge will occur in states 17–20. A negative control pulse 41 is then sent. If the frequency is somewhat low, the edge will appear in states 23–27 and a positive control pulse 41 will be generated. Since a negative control pulse 41 is also generated in state 16, the state machine attempts to adjust the frequency in such a way that the edge detector 46 signals edges in states 16 or 27. As a result of the integration of the control pulses in 42, the phase position of the receiver base clock rate 45 is constant relative to the transmission data stream 47 and fluctuates smoothly between states 16 and 27. If an edge is indicated in state 21 or 22, the switching logic interprets this as an excessive deviation and returns to the frequency-selective mode corresponding to FIG. 5 so as to readjust the frequency. The state machine described in the present example very easily decides whether or not the phase-locked loop is locked in. The PLL is locked in as long as it is in the phase-sensitive mode and not otherwise.

The phase-locked loop described above with reference to FIG. 4 works particularly well when many level changes are contained in the transmission data stream 47. According to the invention, a special coding according to FIG. 2 and Table 1 is realized in the coding device for this purpose. The coding device and decoding device are accordingly matched.

Figure 7:
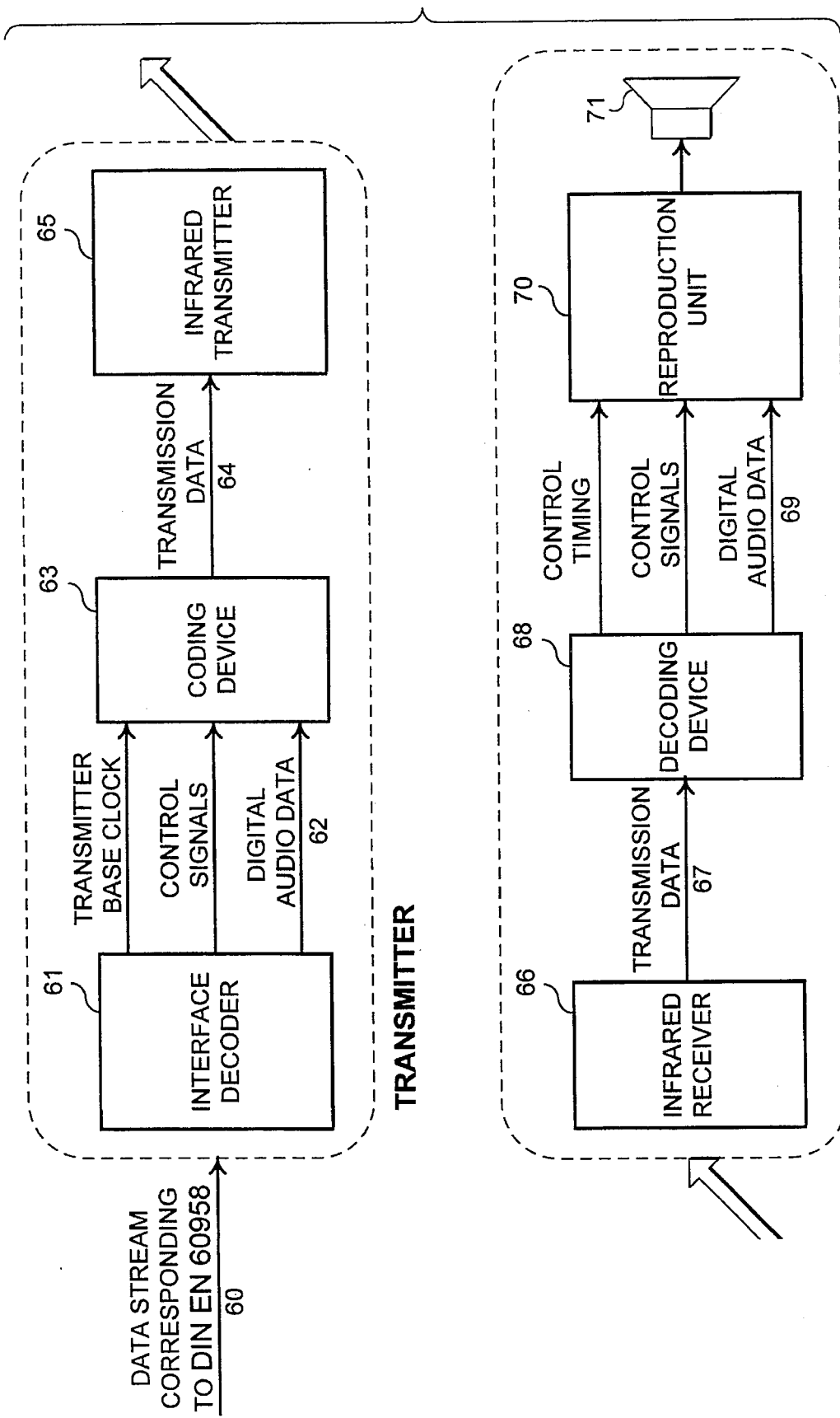
FIG. 7 shows a device, according to the invention, with a transmitter part and a receiver part.

A transmission device corresponding to FIG. 7 can be constructed with the coder and decoder described in FIGS. 1 and 3. Digital audio data 60 corresponding to DIN EN 60958 are received by an interface decoder and the control signals 62 for the coding device 63 are generated. The generated transmission data 64 are radiated via an infrared transmitter 65.

An infrared receiver 66 receives the optical signals and regenerates the transmission data 67. These transmission data are decoded by the decoding device 68 with the clock pulse recovery corresponding to FIG. 4 and fed to a reproduction unit 70 with a reproduction transducer 71.

The low expenditure on the decoding device which is still further reduced especially by integrating the digital components corresponding to FIGS. 3 and 4 in a customized integrated circuit makes this solution particularly suitable for compact battery-operated receivers. The low data rate of the transmission data which, according to the invention, is only 33% higher than the net audio signal data rate requires only small receiver bandwidths so that good working ranges and resistance to interference are achieved in wireless transmission.

The data rates occurring in conjunction with source interfaces according to DIN EN 60598 require only a relatively small frequency window for clock pulse recovery in the decoding device. The design of the voltage-controlled oscillator is simplified in this way.

Figure 6:
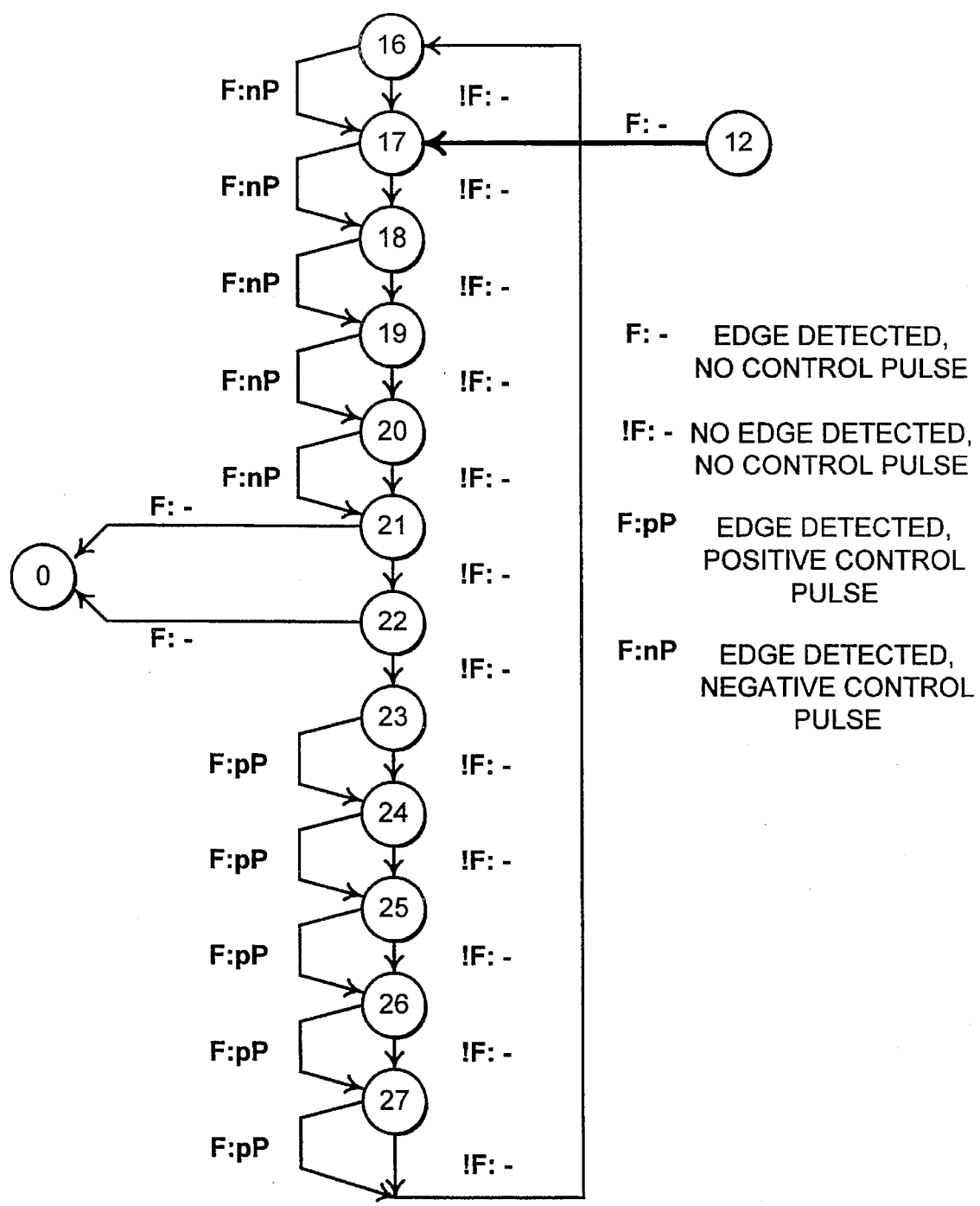

The coding and decoding strategy presented herein with data frames corresponding to FIG. 2, a block coding corresponding to Table 1, clock pulse recovery corresponding to FIG. 4 and a switching logic corresponding to FIGS. 5 and 6 provides an effective solution to the problem of wireless transmission of digital audio signals.

TABLE 1

| 4-bit blocks of audio data | 5-bit blocks |
| --- | --- |
| 0000 | 01010 |
| 0001 | 10100 |
| 0010 | 11010 |
| 0011 | 01001 |
| 0100 | 10010 |
| 0101 | 10111 |
| 0110 | 11101 |
| 0111 | 11110 |
| 1000 | 01110 |
| 1001 | 11001 |
| 1010 | 01111 |
| 1011 | 11011 |
| 1100 | 10110 |
| 1101 | 01101 |
| 1110 | 10101 |
| 1111 | 01011 |

TABLE 2

| sampling rate | transmission data rate |
| --- | --- |
| 32 kHz | 256 × sampling rate/4 = 2.048 Mbit/s |
| 44.1 kHz | 256 × sampling rate/6 = 1.8816 Mbit/s |
| 48 kHz | 256 × sampling rate/6 = 2.048 Mbit/s |

What is claimed is:

1. A process for the wireless transmission of digital audio data, comprising the steps of:

based on digital stereo sampling values (audio data 3) having a word length of 16 bits in each instance and based on a system clock rate of 256-times the sampling rate (transmitter base clock 1), forming a data frame having a bit length of 128 bits for the transmission data (9, 20, 47), wherein the data frame contains three stereo sampling values (3) at the sampling rates of 48 kHz (A) and 44.1 kHz (B) or two stereo sampling values (3) at the sampling rate of 32 kHz (C) and, instead of the third stereo sampling value (3), contains a filling pattern and coded information about the current sampling rate;

sending the transmission data (9, 20, 47) at a transmission data rate which is obtained from the transmission base clock (1) by integral division;

feeding the transmission data (9, 20, 47) after transmission to a receiver parallel to a decoding device (24, 25, 26) and to a clock pulse recovery (21);

regenerating a clock pulse (22, 45) which is an integral multiple of (N-times) the transmission data rate by the clock pulse recovery (21); and deriving by integral division the clock pulses required for a channel decoder (block decoder 25) for decoding the data stream of the data frames of 128-bit length, by a receiver base clock (22) and the transmitter base clock (1) which is 256-times the sampling rate.

2. The process according to claim 1, wherein the transmission data rate is obtained from the transmitter base clock (1) by dividing by 6 at sampling rates of 48 kHz (A) and 44.1 kHz (B) or by dividing by 4 at the sampling rate of 32 kHz (C).

3. The process according to claim 1, wherein the clock (2, 45) regenerated in the clock pulse recovery (21) is 12-times the transmission data rate (N=12).

4. The process according to claim 1, wherein the audio data (3) and the filling pattern, if any, are provided with a code conversion from 4 bits to 5 bits, specifically with a code which generates a frequent level change in the data stream, wherein code words which generate frequent level changes especially when repeated are used in allocating for the code conversion to 5-bit code words in bit groups which occur frequently in digital audio signals.

5. The process according to claim 4, wherein during code conversion the 5-bit code words corresponding to the 4-bit data are allocated in accordance with the code in the following coding table:

| 4-bit blocks of audio data (3) | recoded 5-bit blocks |
| --- | --- |
| 0000 | 01010 |
| 0001 | 10100 |
| 0010 | 11010 |
| 0011 | 01001 |
| 0100 | 10010 |
| 0101 | 10111 |
| 0110 | 11101 |
| 0111 | 11110 |
| 1000 | 01110 |
| 1001 | 11001 |
| 1010 | 01111 |
| 1011 | 11011 |
| 1100 | 10110 |
| 1101 | 01101 |
| 1110 | 10101 |
| 1111 | 01011 |

6. The process according to claim 4, wherein a 5-bit group which does not occur in the code for conversion of the audio data (3) and filling pattern, if any, is placed at the beginning of the data frame as a preamble (8) in a register of the coding device (63) as synchronization characteristic for detecting the start of the frame in the decoding device (68).

7. The process according to claim 4, wherein the transmission data (9, 20, 47) arriving at the receiver are checked in a preamble detector (27) to determine whether or not they have, at the starting position, the 5-bit group which was selected as a preamble and, if this preamble is present, the original digital audio data (3) which are then converted in the block coder (5) or in the coding device (63) are reproduced therefrom in the block decoder (25) in 4-bit groups corresponding to the conversion code.

8. The process according to claim 1, wherein an infrared light which is timed with the transmission data (9, 20, 47) is used as transmission medium.

9. The process according to claim 1, wherein the transmission data (9, 20, 47) are first modulated to a high-frequency carrier and are then transmitted by infrared light.

10. The process according to claim 1, wherein a HF carrier which is timed with the transmission data (9, 20, 47) is used as transmission medium.

11. The process according to claim 16, wherein the transmission data (9, 20, 47) are modulated to a HF carrier.

12. A device for carrying out a process for the wireless transmission of digital audio data, comprising the steps of, based on digital stereo sampling values (audio data 3) having a word length of 16 bits in each instance and based on a system clock rate of 256-times the sampling rate (transmitter base clock 1), forming a data frame having a bit length of 128 bits for the transmission data (9, 20, 47), wherein the data frame contains three stereo sampling values (3) at the sampling rates of 48 kHz (A) and 44.1 kHz (B) or two stereo sampling values (3) at the sampling rate of 32 kHz (C) and, instead of the third stereo sampling value (3), contains a filling pattern and coded information about the current sampling rate, sending the transmission data (9, 20, 47) at a transmission data rate which is obtained from the transmission base clock (1) by integral division, feeding the transmission data (9, 20, 47) after transmission to a receiver parallel to a decoding device (24, 25, 26) and to a clock pulse recovery (21), regenerating a clock pulse (22, 45) which is an integral multiple of (N-times) the transmission data rate by the clock pulse recovery (21), and deriving by integral division the clock pulses required for a channel decoder (block decoder 25) for decoding the data stream of the data frames of 128-bit length, by a receiver base clock (22) and the transmitter base clock (1) which is 256-times the sampling rate, with channel coding taking place in a coding device (63) and based upon a transmitter base clock (1) and with decoding talking place in a decoding device (68), said device comprising that:

said decoding device (68), for the purpose of clock pulse recovery (21) containing a phase control loop (PLL 40, 42, 44, 46) with a flank detector (46) for signaling the change in level, a filter (42), and a voltage-controlled oscillator (VCO 44);

said phase control loop (PLL 40, 42, 44, 46) containing a state machine (40) which operates in frequency-selective mode as well as in phase-selective mode as a frequency comparator and phase comparator for clock pulse recovery and multiplication by the factor N;

said state machine (40) being coupled on an input side with said flank detector (46) and voltage-controlled oscillator (44) and on an output side with said filter (42); and said state machine (40) remaining in a basic state of a first, frequency-selective work cycle with a quantity of possible recurring states until the incoming data stream has a change in level, is then switched farther at every clock pulse by one state in this first work cycle and, when no further change in level occurs, returns to the basic state of this first work cycle after passing through the quantity of possible repeating states, but passes into the state following the basic state when a change in level occurs and, in so doing, transmits a positive control pulse (41) to the filter (42) if less than N clock pulses have occurred since the last change in level, or transmits a negative control pulse (41) to the filter (42) if more than N clock pulses have occurred since the last change in level, or, finally, jumps to a second, phase-selective work cycle with N possible repeating states if exactly N clock pulsers have occurred since the last change in level; and said state machine being then switched farther at every clock pulse by one state in the second work cycle, wherein a negative control pulse (41) is sent to the filter (42) whenever a change in level occurs in the region between the state (16) before the jumping point (17) until the state N/4 (third state 20, where N=12, 20) after the jumping point (17), or a positive control pulse (41) is sent to the filter (42) whenever a change in level occurs in the region between the state N/2 (sixth state 23, where N=12) after the jumping point (17) until the state 5/6 N (tenth state 27, where N=12) after the jumping point (17), or jumps back into the basic state (0) of the first work cycle without initiating a control pulse (41) when a change in level occurs in the region between the state N/3 (fourth state 21, where N=12) and state 5/12 N, (fifth state 22, where N=12) after the jumping point (17), i.e., when there is an excessive divergence in frequency between the Nth of the receiver basic clock (22, 45) and the transmission data rate. (FIGS. 4, 5 and 6).

13. The device according to claim 12, wherein an interface decoder (61), which has a signal feed (60) in accordance with DIN EN 60958, serves as a source for the system clock (I) and the digital audio data (3).

* * * * *

UNITED STATES PATENT AND TRADEMARK OFFICE
CERTIFICATE OF CORRECTION

PATENT NO. : 5,596,603
DATED : January 21, 1997
INVENTOR(S) : Axel Haupt It is certified that error appears in the above-identified patent and that said Letters Patent is hereby corrected as shown below:

On the title page, Item [75], change "Karl-Hermann Delibruegge" to read

--Karl-Hermann Dellbruegge--

Signed and Sealed this

Eighth Day of April, 1997

*Attest:*

BRUCE LEHMAN

*Attesting Officer*  *Commissioner of Patents and Trademarks*